(12) United States Patent
Hsu et al.

(10) Patent No.: US 9,148,021 B2
(45) Date of Patent: Sep. 29, 2015

(54) METHOD FOR CONTROLLING ALTERNATING CURRENT OUTPUT OF PHOTOVOLTAIC DEVICE AND ALTERNATING CURRENT PHOTOVOLTAIC DEVICE

(75) Inventors: Jung-Tsung Hsu, Hsinchu (TW);
Wen-Yung Yeh, Hsinchu County (TW);
Ming-Hsien Wu, Tainan (TW);
Wen-Yih Liao, Taichung (TW); Mu-Tao Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 704 days.

(21) Appl. No.: 13/517,556

(22) Filed: Jun. 13, 2012

(65) Prior Publication Data
US 2013/0250630 A1 Sep. 26, 2013

(30) Foreign Application Priority Data

Mar. 21, 2012 (TW) .............................. 101109711 A

(51) Int. Cl.
*H02J 1/00* (2006.01)
*H02N 6/00* (2006.01)
*H01L 31/042* (2014.01)
*H02J 3/38* (2006.01)
*H02M 7/44* (2006.01)
*H02S 10/00* (2014.01)

(52) U.S. Cl.
CPC ............... *H02J 3/383* (2013.01); *H01L 31/042* (2013.01); *H02M 7/44* (2013.01); *H02N 6/00* (2013.01); *Y02E 10/563* (2013.01)

(58) Field of Classification Search
CPC ........ H02M 7/44; H02J 3/383; Y02E 10/563; H01L 31/042; H02N 6/00
USPC ............................... 307/78, 71; 136/244, 252
See application file for complete search history.

(56) References Cited

U.S. PATENT DOCUMENTS

| | | | |
|---|---|---|---|
| 4,217,633 A | 8/1980 | Evans, Jr. | |
| 4,533,783 A | 8/1985 | Benjamin et al. | |
| 4,577,052 A | 3/1986 | Schutten et al. | |
| 6,774,299 B2 | 8/2004 | Ford | |

(Continued)

FOREIGN PATENT DOCUMENTS

| | | |
|---|---|---|
| CN | 1933275 A | 3/2007 |
| CN | 101741273 A | 6/2010 |

(Continued)

OTHER PUBLICATIONS

Machine Translation of Taiwanese patent 563286 to Nakata, Josuke, published Nov. 21, 2003, obbtained from STIC Mar. 26, 2015.*

(Continued)

*Primary Examiner* — Hal Kaplan
(74) *Attorney, Agent, or Firm* — J.C. Patents

(57) ABSTRACT

A method for controlling an alternating current (AC) output of a photovoltaic (PV) device, and an AC PV device are introduced herein. The method includes: receiving solar radiant energy by using a PV cell array and then converting the solar radiant energy into a direct current (DC) energy output; and selecting an arrangement and combination sequence of the PV cells by using a control module, to vary a voltage according to a timing (frequency), so that a sine-like wave output is obtained at an output terminal.

28 Claims, 8 Drawing Sheets

(56) References Cited

U.S. PATENT DOCUMENTS

| | | | |
|---|---|---|---|
| 7,411,802 B2 | 8/2008 | Victor et al. | |
| 8,022,571 B2* | 9/2011 | Warren et al. | 307/64 |
| 8,288,892 B2* | 10/2012 | Gaul | 307/71 |
| 8,329,503 B1* | 12/2012 | Nielson et al. | 438/98 |
| 2004/0031516 A1 | 2/2004 | Ford | |
| 2005/0034750 A1 | 2/2005 | Rabinowitz | |
| 2005/0286281 A1 | 12/2005 | Victor et al. | |
| 2011/0019453 A1 | 1/2011 | Gonzalez Senosiain et al. | |
| 2013/0250630 A1* | 9/2013 | Hsu et al. | 363/39 |

FOREIGN PATENT DOCUMENTS

| | | |
|---|---|---|
| CN | 101980409 A | 2/2011 |
| CN | 102088193 A | 6/2011 |
| CN | 202004681 U | 10/2011 |
| TW | 563286 | 11/2003 |
| TW | 201014150 | 4/2010 |
| TW | M413225 | 10/2011 |
| TW | 201211724 | 3/2012 |
| TW | 201212251 | 3/2012 |

OTHER PUBLICATIONS

"Office Action of Taiwan Counterpart Application", issued on Jul. 29, 2014, p. 1-p. 9.

Bradaschia et al., "Modulation for Three-Phase Transformerless Z-Source Inverter to Reduce Leakage Currents in Photovoltaic Systems", IEEE Transactions on Industrial Electronics, Dec. 2011, pp. 5385~5395, vol. 58, No. 12.

Lalili et al., "Input output feedback linearization control and variable step size MPPT algorithm of a grid-connected photovoltaic inverter", Renewable Energy, Jun. 12, 2011, pp. 3282~3291, vol. 36.

Wai et al, "Dual Active Low-Frequency Ripple Control for Clean-Energy Power-Conditioning Mechanism", IEEE Transactions on Industrial Electronics, Nov. 2011, pp. 5172~5185, vol. 58, No. 11.

Brinkhaus et al., "All year power supply with off-grid photovoltaic system and clean seasonal power storage", Solar Energy, Aug. 16, 2011, pp. 2488~2496, vol. 85.

Cagnano et al., "Online Optimal Reactive Power Control Strategy of PV Inverters", IEEE Transactions on Industrial Electronics, Oct. 2011, pp. 4549~4558, vol. 58, No. 10.

* cited by examiner

METHOD FOR CONTROLLING ALTERNATING CURRENT OUTPUT OF PHOTOVOLTAIC DEVICE AND ALTERNATING CURRENT PHOTOVOLTAIC DEVICE

CROSS-REFERENCE TO RELATED APPLICATION

This application claims the priority benefit of Taiwan application serial no. 101109711, filed on Mar. 21, 2012. The entirety of the above-mentioned patent application is hereby incorporated by reference herein and made a part of this specification.

BACKGROUND

1. Technical Field

The technical field relates to a method for controlling an alternating current (AC) output of a photovoltaic (PV) device, and an AC PV device.

2. Background

A basic structure of a solar cell is a semiconductor device with a P-N junction, and a direct current (DC) output is generated at two terminals of the P-N junction under sunlight irradiation. However, since the AC current predominates in current grid power system, the DC output of the solar cell cannot be directly integrated with the grid power for application. Therefore, the DC output can be merely supplied to drive a DC load, and needs a good load matching in order to achieve an optimum efficiency performance. Such a system is frequently found to be used in an apparatus in urgent need of power or in an outdoor area without power supply.

For the purpose of feeding the DC output of the solar cell into the grid power system, a PV inverter is a main device currently used for converting electric energy types. The DC output of the solar cell can be converted into an AC output through boost and frequency modulation of the PV inverter, which can be used as a private power source by a user, and also used as a public power source.

However, since the PV inverter involves electrical safety, the fabrication is difficult and a certification procedure is severe. Moreover, in order to effectively achieve high efficiency performance of photoelectric conversion, some PV cell systems are installed at positions at which it is hard to frequently maintain and displace the systems, for example, a sparsely populated desert district. Therefore, besides the limitations on the cost, size and maintenance of the conventional inverter depending on power rating per unit PV cell, complicated circuit design and other factors (e.g. a severe operating environment) also result in undesirable reliability and inconvenience of the inverter.

U.S. Pat. No. 4,217,633 discloses a technology in which a combination of three circuits is used to replace the conventional inverter.

U.S. Pat. No. 4,533,783 discloses that two symmetrical areas are made on a PV cell structure, and selection of an operating area in a single timing is determined by using an AC input, so as to control an electric energy output direction and obtain an AC output.

U.S. Pat. No. 4,577,052 discloses that two PV cells with contrary polarities are connected in parallel, incident solar radiation is controlled to be projected on a single PV cell unit by using an optical element, and timing swap is controlled by an AC signal to obtain an AC output.

SUMMARY

One of exemplary embodiments comprises a method for controlling an AC output of a PV device. In the method, a PV cell array is provided, in which the PV cell array includes a plurality of PV cells capable of receiving solar radiant energy and converting the solar radiant energy into a DC energy output. An arrangement and combination sequence of the PV cells is selected by using a control module, to vary a voltage of the DC energy output according to a frequency, so that a sine-like wave output is obtained at an output terminal.

Another of exemplary embodiments comprises an AC PV device. The AC PV device comprises a PV cell array and a control module. The PV cell array includes a plurality of PV cells capable of receiving solar radiant energy and converting the solar radiant energy into a DC energy output. The control module is used to control the PV cell array, and includes, for example, an output selector capable of selecting a mode of AC output or DC output, a cell sequence selection unit capable of controlling an arrangement and combination sequence of the PV cells, and an AC frequency control unit. The AC frequency control unit determines a time domain range of a sine-like wave output by setting a sampling interval according to an AC signal input, in which the sine-like wave output is formed by a voltage of the DC energy output varied according to the frequency.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
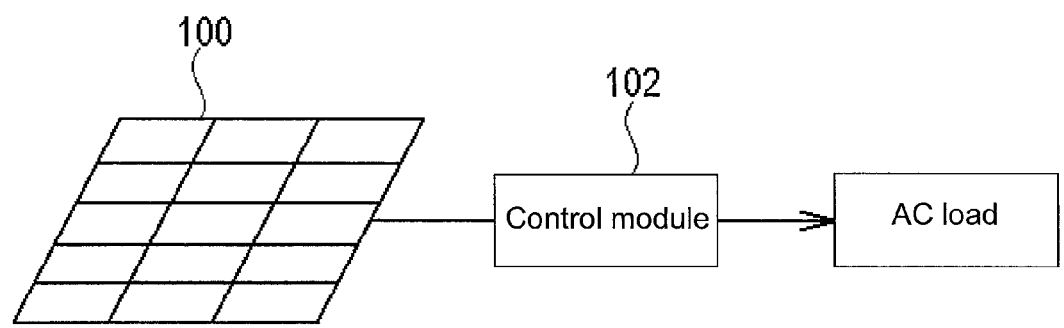
FIG. 1 is a schematic view of an AC PV device according to a first exemplary embodiment.

FIG. 1 is a schematic diagram of an AC PV device according to a first exemplary embodiment. FIG. 1 shows a PV cell array 100 and a control module 102, in which the PV cell array 100 includes a plurality of PV cells capable of receiving solar radiant energy and converting the solar radiant energy into a DC energy output. The control module 102 can select an arrangement and combination sequence of the PV cells in the PV cell array 100, vary a voltage of the DC energy output according to a timing (that is, frequency), and provide the voltage to an AC load. A detailed control manner in the first exemplary embodiment will be described in the following.

Figure 2:
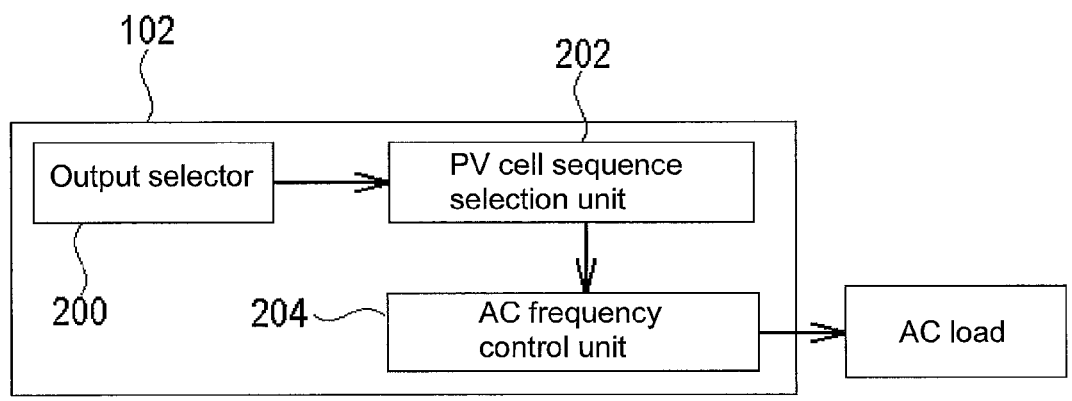
FIG. 2 is a system diagram of a control module of the AC PV device according to the first exemplary embodiment.

FIG. 2 is a system diagram of the control module 102 of the AC PV device according to the first exemplary embodiment. The control module 102 for controlling the PV cell array 100 in FIG. 1 at least includes an output selector 200, a PV cell sequence selection unit 202 and an AC frequency control unit 204. The output selector 200 can select the mode for AC output or DC output. When the AC PV device selects the mode of AC output, the PV cell sequence selection unit 202 controls the arrangement and combination sequence of the PV cells and output a sine-like wave. In one embodiment, the sine-like wave output comprises a ladder-shaped wave output. The AC frequency control unit 204 determines a time domain range of the ladder-shaped wave output by setting a sampling interval according to an AC signal input, in which the ladder-shaped wave output is formed by varying the voltage of the DC energy output of the PV cell array 100 in FIG. 1 according to the frequency.

Figure 3:
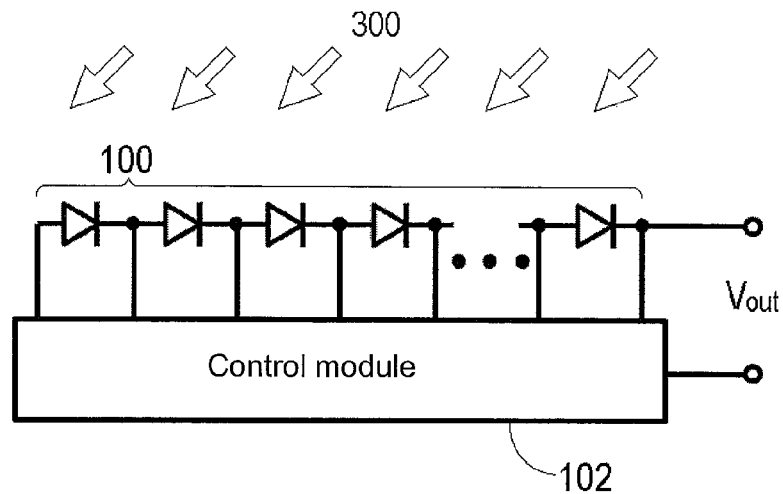
FIG. 3 is a schematic view of a PV cell array according to the first exemplary embodiment.

For example, when the PV cells in the PV cell array 100 are all connected in series under the control of the PV cell sequence selection unit 202 as shown in FIG. 3, and two terminals of a single PV cell are each connected to the control module 102. If n PV cells of the same type exist, and each PV cell can provide a DC energy output with a voltage $V_{sc}$, an output voltage of the AC PV device in this timing is $V_{out} = n \times V_{sc}$. However, in this exemplary embodiment, the PV cells of different types may also be connected in series, and then groups thereof are connected in parallel, through which the same voltage output may be obtained, where the number of the PV cells connected in series and the types of the PV cells depend on the selected material of the PV cells, and may be the same or different, as long as the combination thereof can provide the same output voltage $V_{out}$. The PV cell may be, for example, a silicon-based solar cell, a compound solar cell, a film solar cell, an organic solar cell or a combination thereof.

Figure 4:
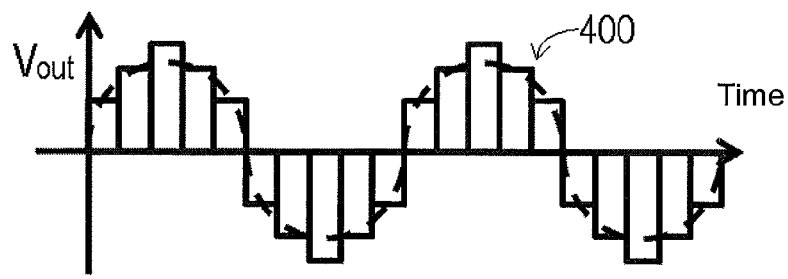
FIG. 4 illustrates a sine-like wave output obtained by combining AC PV device combinations in different timings according to the first exemplary embodiment.

Referring to FIG. 3, when sunlight 300 irradiates the PV cell array 100 and the timing is divided into several segments, by using the AC frequency control unit 204 in FIG. 2, an increasing or descending electric energy output $V_{out}$ is obtained in a single segment of timing with a combined configuration of different PV cells. Through the combination of PV cell combinations in different timings, a sine-like wave output 400 as shown in FIG. 4 may be obtained at an output terminal, and the more the divided timings, the closer the sine-like wave to a sine wave. For example, if a step number of the sine-like wave output is 17 or more, the sine-like wave may be regarded as a quasi-sine wave.

The manner for controlling the arrangement and combination sequence of the PV cells by the PV cell sequence selection unit 202 will be described in detail as follows.

Figure 5:
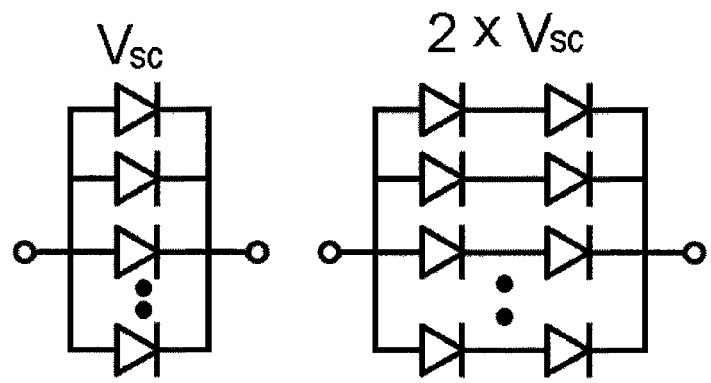
FIG. 5 illustrates arrangement and combination sequences of the PV cells in FIG. 3 in different timings.

FIG. 5 illustrates arrangement and combination sequences of the PV cells in FIG. 3 in different timings ($t_1$ and $t_2$). In the timing $t_1$, all the PV cells are combined and connected in parallel by the PV cell sequence selection unit of the control module as shown in a left side of FIG. 5. After the PV cells receive the solar radiation energy, each PV cell can provide a DC output with a voltage $V_{sc}$, and the output voltage at the two terminals after the PV cells are connected in parallel is also $V_{sc}$. In the timing $t_2$, the PV cell sequence selection unit selects an arrangement that two of all the PV cells are first connected in series into one group, and then the groups are connected in parallel, as shown in a right side of FIG. 5. After the PV cells receive the solar radiation energy, the output voltage at the two terminals is $2 \times V_{sc}$. Accordingly, with the change of the timings, an increasing or descending energy output (output voltage) may be obtained, and finally, a ladder-shaped AC output is obtained through combination in the timing range.

Figure 6:
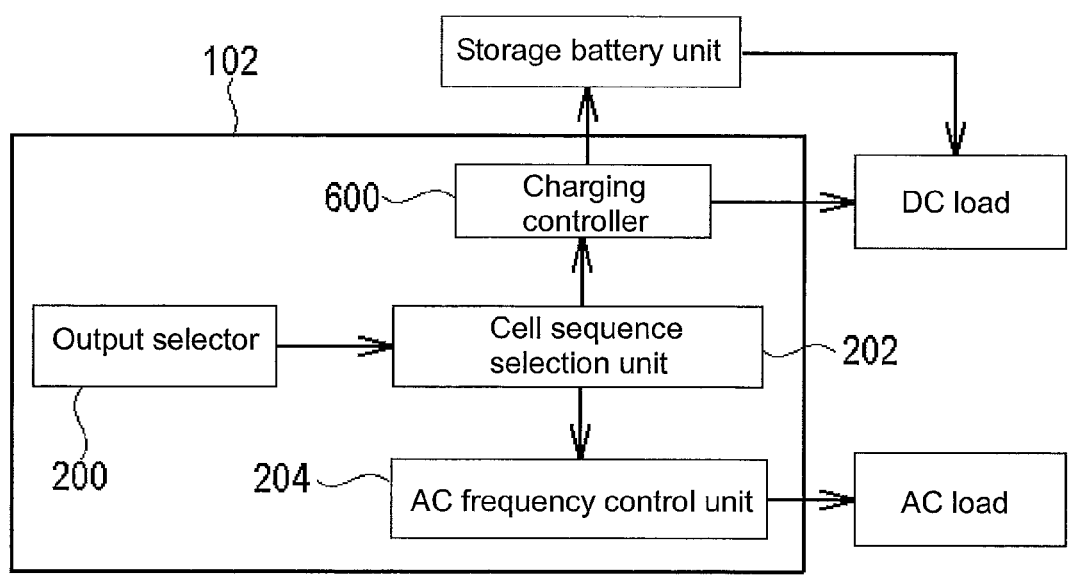
FIG. 6 is a system diagram of another example of the control module according to the first exemplary embodiment.

FIG. 6 is a system diagram of another example of the control module according to the first exemplary embodiment, in which the same element numerals as those in FIG. 2 are used to represent the same elements.

In FIG. 6, the control module 102 may further include a charging controller 600, for supplying a power to a DC load when the output selector 200 selects the mode of DC output. In addition, the electric energy of the DC output of the PV cells may also be stored in a storage battery unit for use by a DC load.

Figure 7:
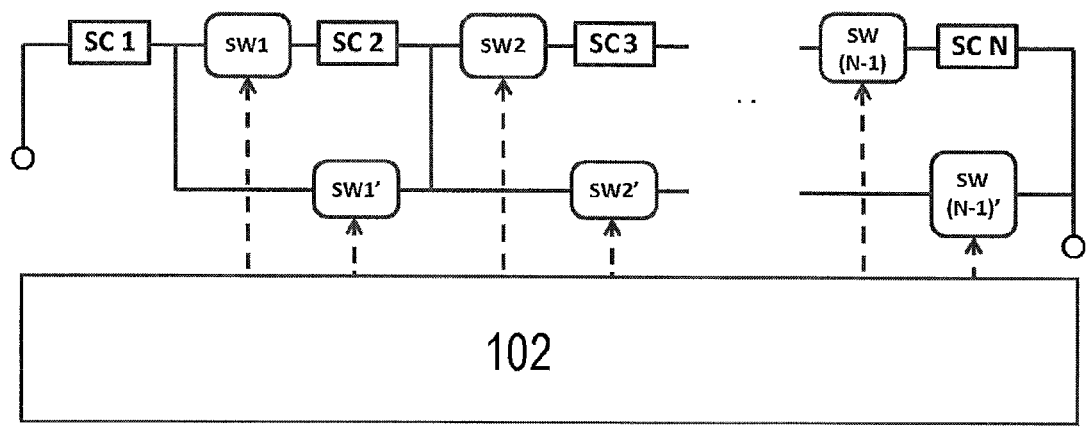
FIG. 7 illustrates a circuit application example of the AC PV device according to the first exemplary embodiment.

FIG. 7 illustrates a circuit application example of the AC PV device according to the first exemplary embodiment. In FIG. 7, a plurality of PV cells SC1, SC2, SC3 . . . SCN (for example, chips or modules) are connected in series, and switch devices SW1, SW2 to SW(N−1) and reverse switch devices SW1', SW2' to SW(N−1)' are disposed between each two of SC1, SC2, SC3 to SCN, so as to form a switch circuit combination. The PV cell sequence selection unit of the control module 102 may select to send a small AC signal, to control states of the switch devices to be an open-circuit state or a short-circuit state, and adjust a voltage output value $V_{out}$. An implementation manner is shown in table 1 to table 5:

TABLE 1

| $V_{in} < V_1$: | | | | |
|---|---|---|---|---|
| $V_{in} < V_1$ | 1 | 2 | 3 | . . . N − 1 |
| SW | Off | Off | Off | Off |
| SW' | On | On | On | On |

$V_{out} = V_{sc}$

TABLE 2

| $V_1 < V_{in} < V_2$: | | | | |
|---|---|---|---|---|
| $V_1 < V_{in} < V_2$ | 1 | 2 | 3 | . . . N − 1 |
| SW | On | Off | Off | Off |
| SW' | Off | On | On | On |

$V_{out} = 2 \times V_{sc}$

TABLE 3

| $V_2 < V_{in} < V_3$: | | | | | |
|---|---|---|---|---|---|
| $V_2 < V_{in} < V_3$ | 1 | 2 | 3 | ... | N − 1 |
| SW | On | On | Off | | Off |
| SW' | Off | Off | On | | On |

$V_{out} = 3 \times V_{sc}$

TABLE 4

| $V_3 < V_{in} < V_4$: | | | | | |
|---|---|---|---|---|---|
| $V_3 < V_{in} < V_4$ | 1 | 2 | 3 | ... | N − 1 |
| SW | On | On | On | | Off |
| SW' | Off | Off | Off | | On |

$V_{out} = 3 \times V_{sc}$

TABLE 5

| $V_{N-1} < V_{in} < V_N$: | | | | | |
|---|---|---|---|---|---|
| $V_{N-1} < V_{in} < V_N$ | 1 | 2 | 3 | ... | N − 1 |
| SW | On | On | On | | On |
| SW' | Off | Off | Off | | Off |

$V_{out} = (N - 1) \times V_{sc}$ $V_{in}$ refers to a value of a voltage for controlling the switch devices SW1, SW2 to SW(N−1) and the reverse switch devices SW1', SW2' to SW(N−1)'. $V_1, V_2, V_3 \ldots V_N$ refer to a range value of an input voltage $V_{in}$ of the switch devices, for example, when the input voltage is less than $V_1$, the SWs are all turned off while the SW's are all turned on. Likewise, when the input voltage $V_{in}$ is between $V_2$ and $V_3$, SW1 and SW2 are turned on, SW3-SW(N−1) are turned off, SW1' and SW2' are turned off, and SW3'-SW(N−1)' are turned on. The state of the switch devices in other input range may be confirmed in the same way.

Figure 8:
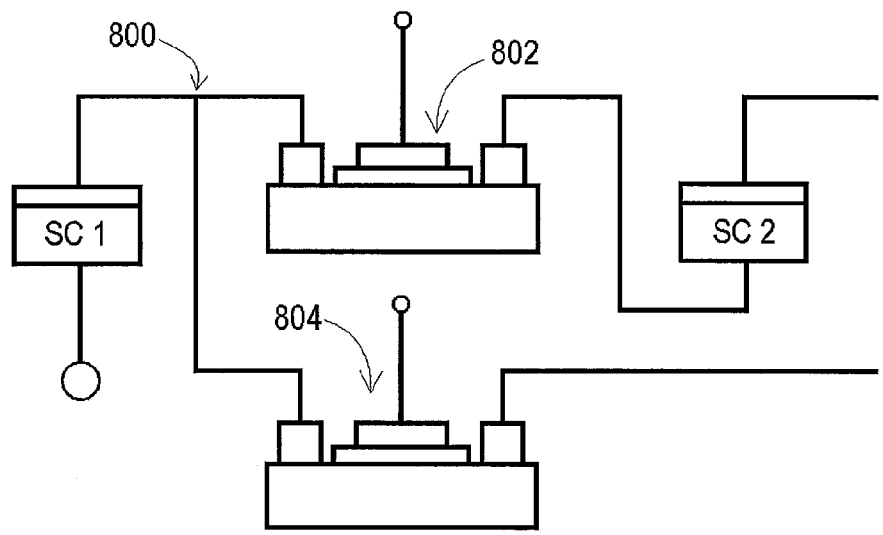
FIG. 8 is an actual circuit architecture diagram of the AC PV device in FIG. 7.

Actual circuit architecture of the switch devices SW1, SW2 to SW(N−1) and the reverse switch devices SW1', SW2' to SW(N−1)' is shown in FIG. 8. When the PV cells (SC1, SC2, SC3 ... SCN) in FIG. 7 are silicon solar cells (or compound solar cells) shown in FIG. 8, a contact 800 of the solar cell SC1 is connected respectively to a Normally OFF channel device 802 (that is, SW1 in FIG. 7) and a Normally ON channel device 804 (that is, SW1' in FIG. 7), and on/off of the channel devices 802 and 804 is controlled by an external small AC signal.

In addition, the switch circuit combination controlled by the cell sequence selection unit of the AC PV device may also have the following examples.

Figure 9:
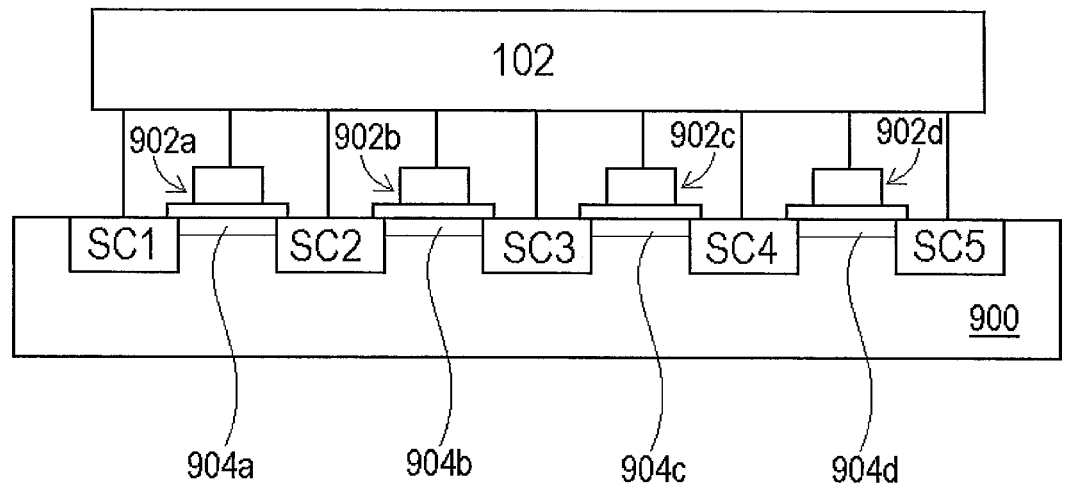
FIG. 9 illustrates an example of using a Metal Oxide Semiconductor (MOS) device as a switch circuit combination of the first exemplary embodiment.
Figure 10:
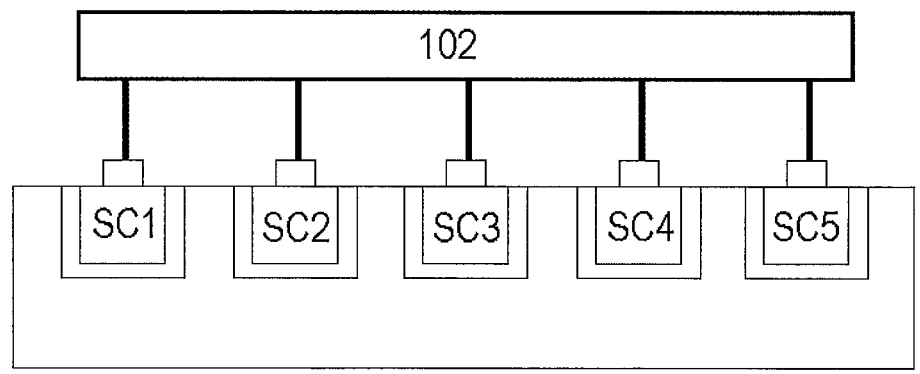
FIG. 10 illustrates another example of using a mechanical switch as a switch circuit combination of the first exemplary embodiment.

First, FIG. 9 illustrates an example of using an MOS device as a switch circuit combination; and FIG. 10 illustrates another example of using a mechanical switch as a switch circuit combination. In addition, for example, a diode device may also be used as the switch circuit and applied to the exemplary embodiments of the disclosure.

In FIG. 9, the PV cells SC1, SC2, SC3, SC4, and SC5 are fabricated on the same substrate 900 in different areas, interval sections are used for segmentation, and switch devices 902a-902d are fabricated on the intervals, so as to control an on/off state of channels 904a-904d. An arrangement and combination sequence of the PV cells SC1, SC2, SC3, SC4, and SC5 is selected under control of the cell sequence selection unit of the control module 102.

In FIG. 10, a mechanical switch (not shown) is directly integrated into the control module 102, to control the PV cells SC1, SC2, SC3, SC4, and SC5.

Figure 11:
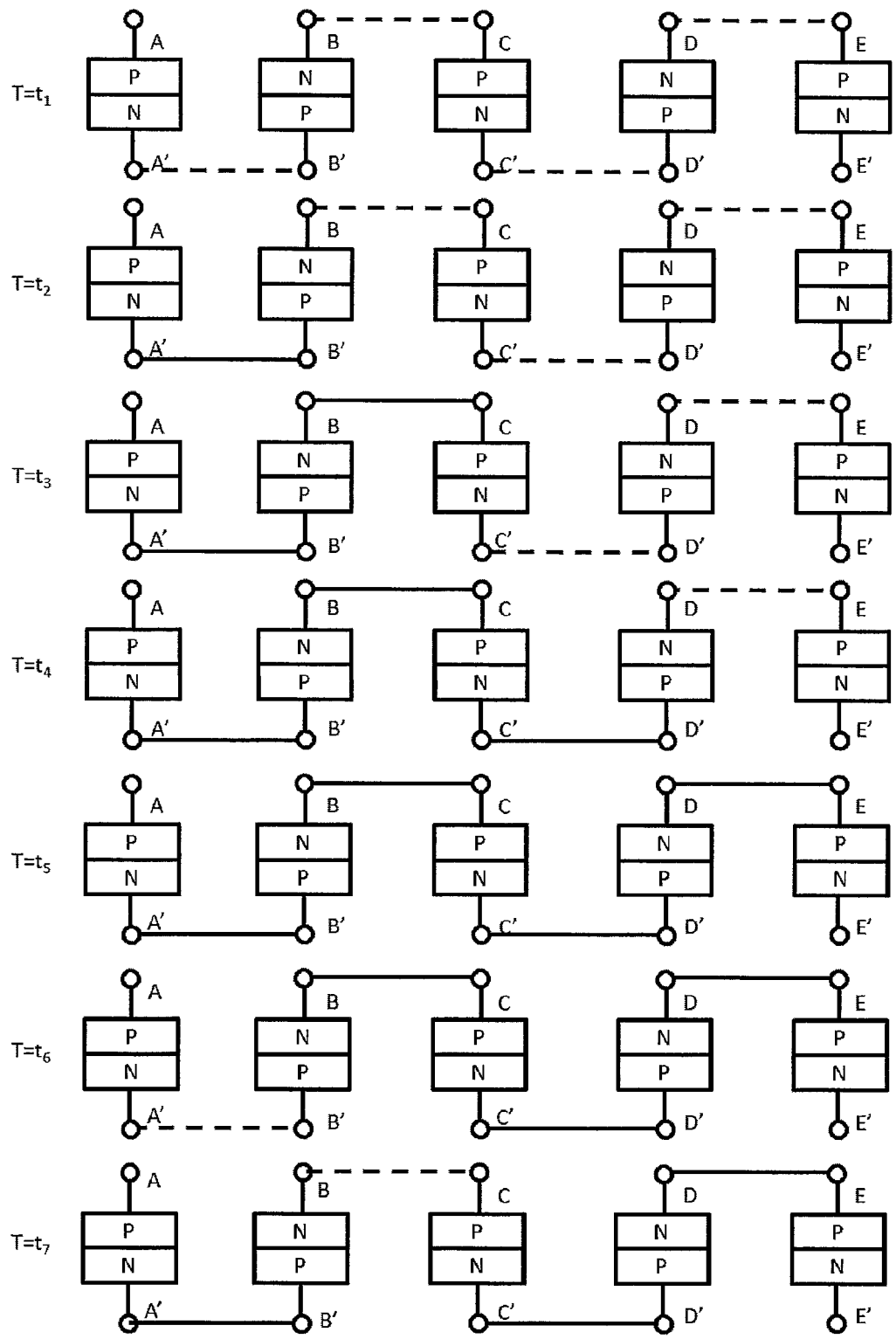
FIG. 11 illustrates another circuit application example of the AC PV device according to the first exemplary embodiment.

FIG. 11 shows another circuit application example of the AC PV device according to the first exemplary embodiment.

In FIG. 11, a plurality of PV cell dies (chips or modules) is arranged into an array, in which a horizontal line represents a connection therebetween, and major units are switch devices (referring to FIG. 9 or FIG. 10); a solid line represents that a state of the switch devices is ON (short circuit), and a dash line represents that a state of the switch devices is OFF (open circuit). The actions thereof vary according to a timing T as follows:

T=$t_1$: merely PV Cell A-A' has an output ($V_{out}$A-A'=1× $V_{sc}$);

T=$t_2$: PV Cells A-A' and B-B' are connected in series for output ($V_{out}$A-B=2×$V_{sc}$);

T=$t_3$: PV Cells A-A', B-B' and C-C' are connected in series for output ($V_{out}$A-C'=3×$V_{sc}$);

T=$t_4$: PV Cells A-A', B-B', C-C' and D-D' are connected in series for output ($V_{out}$A-D=4×$V_{sc}$);

T=$t_5$: PV Cells A-A', B-B', C-C', D-D' and E-E' are connected in series for output ($V_{out}$A-E'=5×$V_{sc}$);

T=$t_6$: PV Cell A-A' has an output ($V_{out}$A-A'=1×$V_{sc}$); and PV Cells B-B', C-C', D-D' and E-E' are connected in series for output ($V_{out}$B'-E'=4×$V_{sc}$); and T=$t_7$: PV Cells A-A' and B-B' are connected in series for output ($V_{out}$A-B=2×$V_{sc}$); and PV Cells C-C', D-D' and E-E' are connected in series for output ($V_{out}$C-E'=3×$V_{sc}$).

Accordingly, through such a control manner, two independent ladder-shaped AC sine waves may be output continuously, thereby avoiding the problem of waste efficiency caused by idle PV cells.

Figure 12:
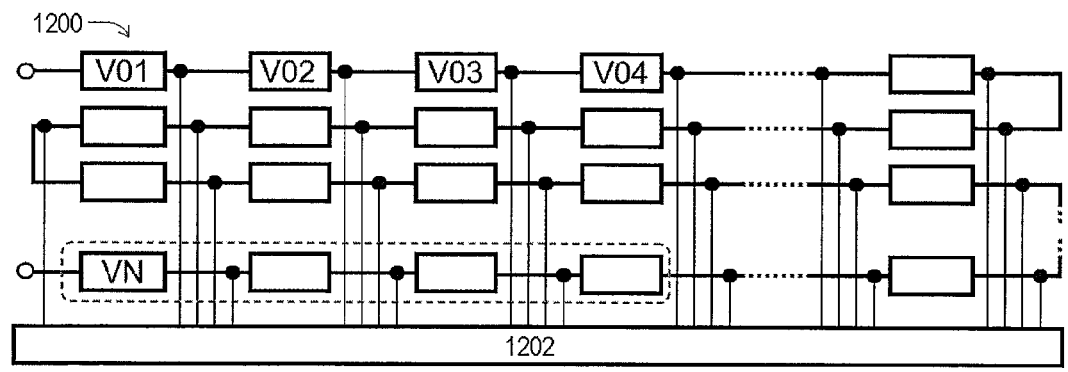
FIG. 12 is a schematic diagram of an AC PV device with PV cells according to a second exemplary embodiment.

FIG. 12 is a schematic diagram of an AC PV device with PV cells according to a second exemplary embodiment.

Referring to FIG. 12, the AC PV device includes a PV cell array 1200 and a control module 1202. V01 to VN represent a plurality of PV cell sub-modules or PV cell units in the PV cell array 1200. If V01=V02= . . . =V50=10V (N=50), using an arrangement and combination sequence shown in table 6, a ladder-shaped AC voltage output of 11 steps can be obtained, in which the output voltage ranges from 10V to 110V.

TABLE 6

| Total number of PV cell units N = 50 | | | | | | |
|---|---|---|---|---|---|---|
| | Output voltage (V) | | | | | |
| | 0 | 10 | 20 | 30 | 40 | 50 |
| Circuit connection | Open | 50 shunt | 2 series/ 25 shunt | 3 series/ 16 shunt | 4 series/ 12 shunt | 5 series/ 10 shunt |
| Number of backup PV cell units | 50 | 0 | 0 | 2 | 2 | 0 |

| | Output voltage (V) | | | | | |
|---|---|---|---|---|---|---|
| | 60 | 70 | 80 | 90 | 100 | 110 |
| Circuit connection | 6 series/ 8 shunt | 7 series/ 7 shunt | 8 series/ 6 shunt | 9 series/ 5 shunt | 10 series/ 5 shunt | 11 series/ 4 shunt |
| Number of backup PV cell units | 2 | 1 | 2 | 5 | 0 | 6 |

The numerals in the circuit connection (i.e. arrangement and combination sequence) in Table 6 indicate the number of the PV cell units. When a part of the PV cell units outputs power, other part of the PV cell units not selected by the cell sequence selection unit is not work in the control module 1202, but be utilized as the backup PV cells. A specific operation is as follows.

Figure 13:
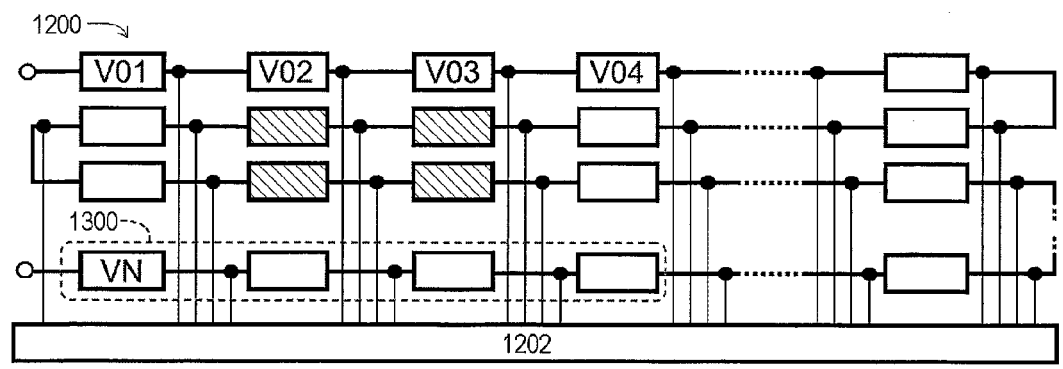
FIG. 13 is a schematic diagram of the AC PV device shown in FIG. 12 with a part of PV cell units are shaded.

As well as FIG. 13, for the AC PV device in FIG. 12, four of the PV cell units are temporarily shaded by an object or a shadow, and cannot normally operate accordingly.

At this time, the PV cell units cannot output a normal voltage, causing an undesirable overall voltage output. Moreover, the voltage output obtained by other PV cell units in the normal operation may act as a reverse bias on the shaded PV cell units, causing the damage of the shaded PV cell units.

Therefore, the AC PV device provided by this exemplary embodiment may be compensated by the backup PV cell units shown in table 6. The compensation actions may be as follows.

1) Some PV cell units are mated with a detection unit in the control module 1202, such as a photo sensor, so as to determine whether each PV cell unit is normally irradiated by the sunlight through optical sensing; if not, circuits of the PV cell units are opened, and instead four backup PV cell units 1300 are used for compensation.

2) An output side of the units in the control module 1202 is mated with a current/voltage detection instrument, and when the combined PV cell unit array is shaded, the current/voltage detection instrument detects a voltage output value of the array, so as to judge whether the PV cell units connected in a period of time are shaded; if any, the circuits of the shaded PV cell units are opened, and instead four backup PV cell units 1300 are used for compensation.

The above descriptions are merely examples of using the backup PV cell units to compensate the shaded PV cell units, but the exemplary embodiment is not limited thereto; and if any, other suitable manners that can detect the shaded PV cell unit array may also be applied herein.

Figure 14:
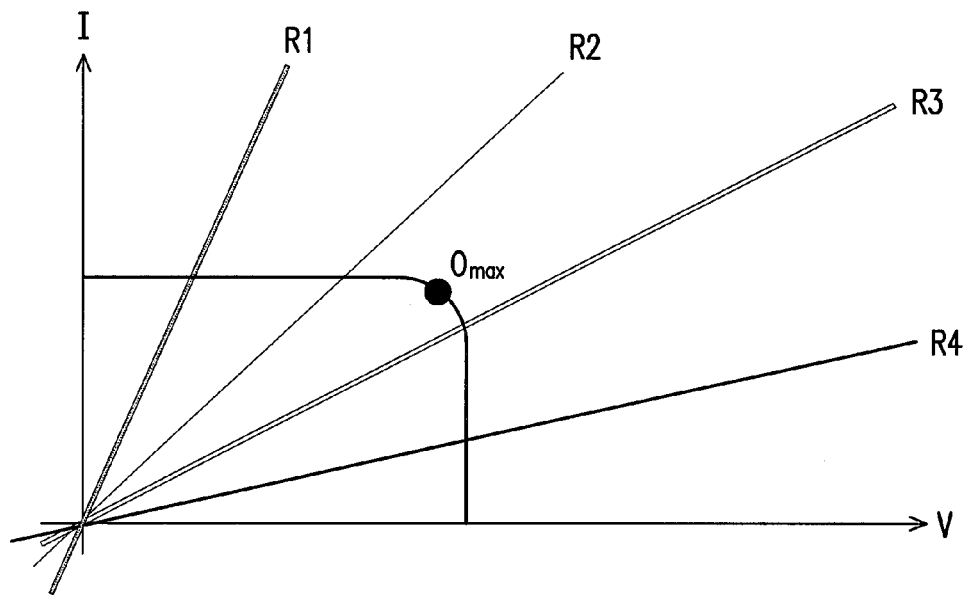
FIG. 14 is an I-V curve diagram illustrating an optimum operating point between different loads and a PV cell array according to an exemplary embodiment.

In addition, the PV device may further provide an effective solution to a resistance matching problem of a DC load. Different electrical equipment such as an electric fan or a television has different loads, as shown in an I-V curve diagram of FIG. 14, in which, R1-R4 are respectively I-V curves of electrical equipment with different loads. The curve is an output curve of the PV cell array, in which $O_{max}$ represents a maximum power value (that is, an optimum operating point) of the PV cell array, that is, a maximum power output can be obtained at this point. However, the I-V curve generally output by the PV cell array does not match the load, and thus the loaded electrical equipment is not operated at the optimum operating point $O_{max}$, so that the PV cell array cannot obtain the optimum output.

Figure 15:
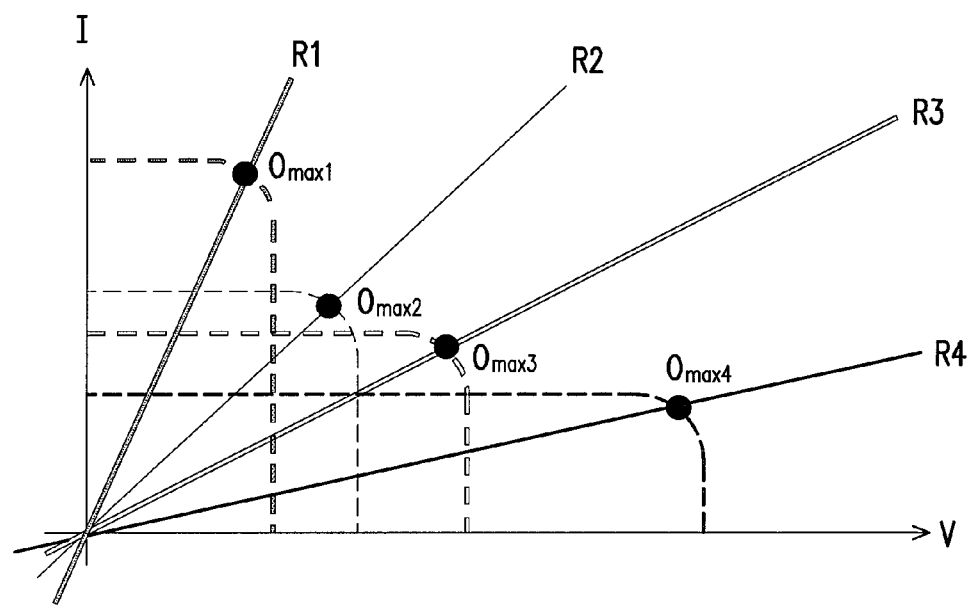
FIG. 15 is an I-V curve diagram illustrating maximum power values suitable for loads R1-R4 obtained by controlling an arrangement and combination sequence of a PV device according to an exemplary embodiment.

Therefore, a third exemplary embodiment of the disclosure provides a method for controlling the arrangement and combination sequence of the PV device, to obtain different maximum power values, thereby achieving a DC energy output efficacy matching a load curve, as shown in FIG. 15. The combination of serial connection and parallel connection of the solar cell array may be controlled by the cell sequence selection unit in the control module, to obtain I-V output curves adaptable to the loads R1-R4 as shown in FIG. 15.

For $O_{max1}$ in FIG. 15, through fewer solar cells connected in series and more solar cells connected in parallel, an output result of a small voltage and a great current is obtained. In contrast, for $O_{max4}$, through more solar cells connected in series and fewer solar cells connected in parallel, an output result of a great voltage and a small current is obtained.

To sum up, in the embodiments of the disclosure, the control module selects a combination sequence of the PV cells, and the voltage is varied to be output in different timings according to the timing (frequency), so as to obtain a sine-like wave output close to an AC output from the AC PV device. Therefore, the AC PV device of the embodiments may reduce a system construction cost (including a maintenance cost), decrease a system size and simplify the design. When the number of the sine-like waves of the sine-like wave output is great, the sine-like wave output may be regarded as a quasi-sine wave output, and thus can be effectively applied to an inductive load, communication or other areas. In addition, in the disclosure, the PV cells that are not selected by the cell sequence selection unit can be used as the backup cells, so as to achieve a timely line protection effect. Moreover, in the disclosure, optimum device efficiency outputs matching different DC loads can be obtained by controlling a combination sequence of PV cells.

It will be apparent to those skilled in the art that various modifications and variations can be made to the disclosed embodiments. It is intended that the specification and examples be considered as exemplary only, with a true scope of the following claims and their equivalents.

What is claimed is:

1. A method for controlling an alternating current (AC) output of a photovoltaic (PV) device, comprising:
   providing a PV cell array, wherein the PV cell array comprises a plurality of PV cells capable of receiving solar radiant energy and converting the solar radiant energy into a direct current (DC) energy output;
   selecting an arrangement and combination sequence of the PV cells by using a control module, to vary a voltage of the DC energy output according to a timing, so that a sine-like wave output is obtained at an output terminal;
   judging whether at least one of the PV cells is shaded through optical sensing or by detecting a voltage output value;
   when some of the PV cells are shaded, opening a circuit of the shaded PV cells by using the control module; and
   compensating by using a plurality of backup PV cells.

2. The method for controlling an AC output of a PV device according to claim 1, wherein the sine-like wave output comprises a ladder-shaped wave output.

3. The method for controlling an AC output of a PV device according to claim 2, wherein a number of ladder-shaped waves of the ladder-shaped wave output is no less than 17.

4. The method for controlling an AC output of a PV device according to claim 1, wherein the selecting of the arrangement and combination sequence of the PV cells by using the control module comprises: enabling all the PV cells to be connected in series to execute the DC energy output.

5. The method for controlling an AC output of a PV device according to claim 1, wherein a manner for selecting the arrangement and combination sequence of the PV cells comprises: selecting the arrangement and combination sequence of the PV cells by using a switch circuit combination.

6. The method for controlling an AC output of a PV device according to claim 5, wherein the switch circuit combination comprises a mechanical switch, a Metal Oxide Semiconductor (MOS) device or a diode device.

7. The method for controlling an AC output of a PV device according to claim 1, wherein the PV cells comprise different types of PV cells.

8. The method for controlling an AC output of a PV device according to claim 1, wherein the PV cells comprise a silicon-based solar cell, a compound solar cell, a film solar cell, an organic solar cell or a combination thereof.

9. The method for controlling an AC output of a PV device according to claim 1, wherein the selecting of the arrangement and combination sequence of the PV cells by using the control module comprises: enabling all the PV cells to be connected in parallel to execute the DC energy output.

10. The method for controlling an AC output of a PV device according to claim 1, wherein the selecting of the arrangement and combination sequence of the PV cells by using the control module comprises: connecting a part of the PV cells in series and then connecting groups in parallel to execute the DC energy output.

11. The method for controlling an AC output of a PV device according to claim 1, wherein the selecting of the arrangement and combination sequence of the PV cells by using the control module comprises: obtaining different maximum power values by changing the arrangement and combination sequence, so as to achieve a DC energy output efficacy matching a load curve.

12. The method for controlling an AC output of a PV device according to claim 1, wherein the backup PV cells comprise the PV cells not selected into the arrangement and combination sequence of the PV cells.

13. An alternating current (AC) photovoltaic (PV) device, comprising:
    a PV cell array, comprising a plurality of PV cells capable of receiving solar radiant energy and converting the solar radiant energy into a direct current (DC) energy output; and
    a control module, controlling the PV cell array, wherein the control module at least comprises:
    an output selector, selecting a mode for AC output or DC output;
    a PV cell sequence selection unit, controlling an arrangement and combination sequence of the PV cells; and
    an AC frequency control unit, determining a time domain range of a sine-like wave output by setting a sampling interval according to an AC signal input, wherein the sine-like wave output is formed by a voltage of the DC energy output varied according to frequency.

14. The AC PV device according to claim 13, wherein the sine-like wave output comprises a ladder-shaped wave output.

15. The AC PV device according to claim 14, wherein a number of ladder-shaped waves of the ladder-shaped wave output is no less than 17.

16. The AC PV device according to claim 13, wherein the PV cell sequence selection unit is used to control all the PV cells to be connected in series to execute the DC energy output.

17. The AC PV device according to claim 13, wherein the AC frequency control unit comprises a switch circuit combination.

18. The AC PV device according to claim 17, wherein the switch circuit combination comprises a mechanical switch, a Metal Oxide Semiconductor (MOS) device or a diode device.

19. The AC PV device according to claim 13, wherein the control module further comprises a charging controller, used to supply power to a DC load or store power in a storage battery unit when the output selector selects the mode of DC output.

20. The AC PV device according to claim 13, wherein the sine-like wave output is supplied to an AC load.

21. The AC PV device according to claim 13, wherein the PV cells comprise different types of PV cells.

22. The AC PV device according to claim 13, wherein the PV cells comprise a silicon solar cell, a compound solar cell, a film solar cell, an organic solar cell or a combination thereof.

23. The AC PV device according to claim 13, wherein the PV cell sequence selection unit is used to control all the PV cells to be connected in parallel to execute the DC energy output.

24. The AC PV device according to claim 13, wherein the PV cell sequence selection unit is used to control a part of the PV cells to be connected in series and then control groups to be connected in parallel for output.

25. The AC PV device according to claim 13, wherein the PV cell sequence selection unit obtains different maximum power values by changing the arrangement and combination sequence, so as to match a DC load curve.

26. The AC PV device according to claim 13, further comprising:
    a detection unit, connected to each of the PV cells to judge whether at least one of the PV cells is shaded;
    wherein when one or more of the PV cells are shaded, the control module is used to open a circuit of the shaded PV cells; and
    at least one backup PV cell, used for compensation.

27. The AC PV device according to claim 26, wherein the detection unit comprises a photo sensor or a current/voltage detection instrument.

28. The AC PV device according to claim 26, wherein the backup PV cell comprises a PV cell in the PV cell array that is not selected by the PV cell sequence selection unit.

* * * * *